(12) United States Patent
Zahn (10) Patent No.: US 8,093,896 B2
(45) Date of Patent: Jan. 10, 2012

(54) UNIFORM MAGNETIC FIELD SPHERICAL COIL FOR MRI

(75) Inventor: Markus Zahn, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 195 days.

(21) Appl. No.: 12/442,235

(22) PCT Filed: Sep. 21, 2007

(86) PCT No.: PCT/US2007/020523
§ 371 (c)(1),
(2), (4) Date: Mar. 20, 2009

(87) PCT Pub. No.: WO2008/036412
PCT Pub. Date: Mar. 27, 2008

(65) Prior Publication Data
US 2010/0019764 A1 Jan. 28, 2010

Related U.S. Application Data

(60) Provisional application No. 60/925,975, filed on Apr. 24, 2007.

(51) Int. Cl.
*G01V 3/00* (2006.01)
(52) U.S. Cl. .................................. 324/309; 324/307
(58) Field of Classification Search .......... 324/300–322; 600/407–445
See application file for complete search history.

(56) References Cited

U.S. PATENT DOCUMENTS

| 4,165,479 | A | 8/1979 | Mansfield | |
|---|---|---|---|---|
| 4,774,468 | A | 9/1988 | Bydder | |
| 7,176,688 | B2 * | 2/2007 | Sato | 324/318 |
| 7,259,562 | B2 * | 8/2007 | Wang et al. | 324/318 |
| 7,982,570 | B2 * | 7/2011 | Burdick et al. | 336/200 |
| 2005/0088179 | A1 | 4/2005 | Sato | |
| 2006/0181277 | A1 | 8/2006 | Wang et al. | |
| 2007/0197953 | A1 | 8/2007 | Slade et al. | |
| 2010/0013482 | A1 * | 1/2010 | Baldo et al. | 324/318 |

FOREIGN PATENT DOCUMENTS

DE 102004033722 6/2005

OTHER PUBLICATIONS

Bydder et al, Use of Spherical Receiver Coils in MR Imaging of the Brain, Journal of Computer Assisted Tomography, pp. 413-414, Mar. 1985, New York.
Babincova et al, Principles of Magnetodynamic Chemotherapy, Medical Hypotheses (2004) 62, 375-377.

* cited by examiner

*Primary Examiner* — Brij Shrivastav
(74) *Attorney, Agent, or Firm* — Weingarten, Schurgin, Gagnebin & Lebovici LLP (57) ABSTRACT

The present invention relates to a spherical design for a magnetic resonance imaging (MRI) coil to provide a compact and light-weight highly uniform magnetic field for a variety of medical imaging applications. A preferred embodiment of the invention provides a transportable MRI system in which the spherical electromagnet can be worn like a helmet by patients for diagnosis and assessment of traumatic brain injuries, for example.

31 Claims, 7 Drawing Sheets

Magnetic Resonance Imaging (MRI)

Larmor Precession of Protons

FIG. 5A

Transverse Magnetization

FIG. 5B

Transverse Relaxation

FIG. 5C

Transverse magnetic field shut off at t = 0

Longitudinal Relaxation

UNIFORM MAGNETIC FIELD SPHERICAL COIL FOR MRI

CROSS REFERENCE TO RELATED APPLICATIONS

The present application claims priority to U.S. Application No. 60/925,975, filed on Apr. 24, 2007, and PCT Application US/2006/036829, filed on Sep. 21, 2006, the entire contents of which is incorporated herein by reference.

BACKGROUND OF THE INVENTION

Uniform magnetic field designs are often based on the Helmholtz coil consisting of two circular coils of radius a each carrying a current I and spaced a distance d apart. If d=a, this results in a magnetic field that that has zero first and second spatial derivatives at the midpoint of the line at z=a/2 joining the centers of the two coils, and thus is highly uniform in the central region between the coils.

At all other points, the magnetic field is spatially varying so that a single pair of Helmholtz coils alone is unsuitable in conventional MRI machines that require extremely uniform magnetic fields. However, an advantage of the Helmholtz coil arrangement is that the central region is easily accessible from the outside.

The magnetic field is approximately uniform in the central region of long thin solenoid coils although the magnetic field is non-uniform in the fringing field near the ends and outside the solenoidal coil. This shape is used in conventional MRI machines to accommodate a full body lying flat.

SUMMARY OF THE INVENTION

The present invention utilizes a system for magnetic resonance imaging (MRI) in which a substantially spherical coil assembly encloses a region to be scanned. In a preferred embodiment, a spherical "fluxball" coil excited by a DC current creates a highly uniform DC magnetic field. The system can comprise two or more spherical coils at relative angles to each other and excited by multiple AC currents with phase differences to create oscillating and rotating magnetic fields that may be useful for therapeutic methods as well as imaging. This system, together with injected magnetic material, for example, to provide for treatment such as hyperthermia, directed drug delivery, enhanced external control of image contrast, etc.

A magnetic resonance imaging system in accordance with a preferred embodiment of the invention can include a magnet assembly, the gradient coil assembly, an RF transmission and reception assembly. A computer can be used to program pulse sequences used for different imaging and/or therapeutic applications. A preferred embodiment utilizes a magnetic field controller programmed to execute pulse sequences in accordance with the invention.

The spherical coil assembly can be configured to partially separate or open to allow insertion of a material to be imaged. In a preferred embodiment, the coil assembly is sized to permit insertion of regions of the human body such as the head, hand or foot for imaging thereof.

BRIEF DESCRIPTION OF THE DRAWINGS

FIGS. 5A-5D generally show representations of longitudinal relaxation in a magnetic resonance imaging system, also known as spin lattice relaxation or T1 recovery, which is the time for the proton magnetization to align with $B_0$ after radio frequency (RF) excitation, and transverse relaxation, also known as spin-spin relaxation or T2 decay, which is the time for transverse magnetization to decay after the RF pulse is removed. FIG. 5B depicts Transverse Magnetization; FIG. 5C shows Transverse Relaxation; and FIG. 5D shows Longitudinal Relaxation.

DETAILED DESCRIPTION OF THE INVENTION

Figure 1:
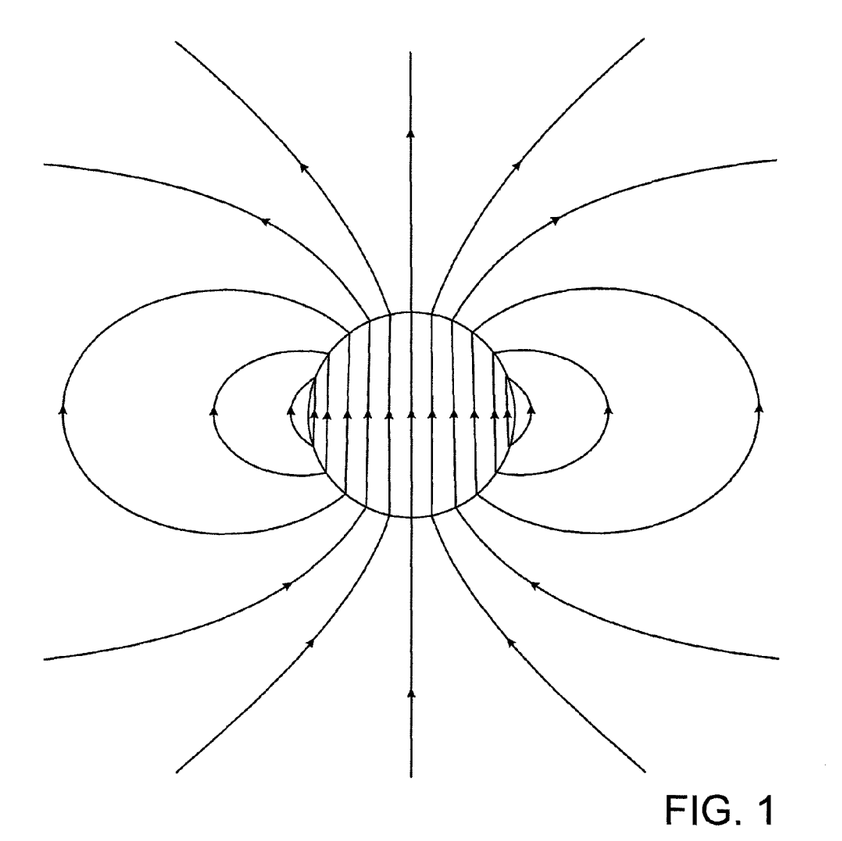
FIG. 1 illustrates a uniform magnetic field within a spherical coil assembly and a point magnetic dipole field outside the assembly.
Figure 2:
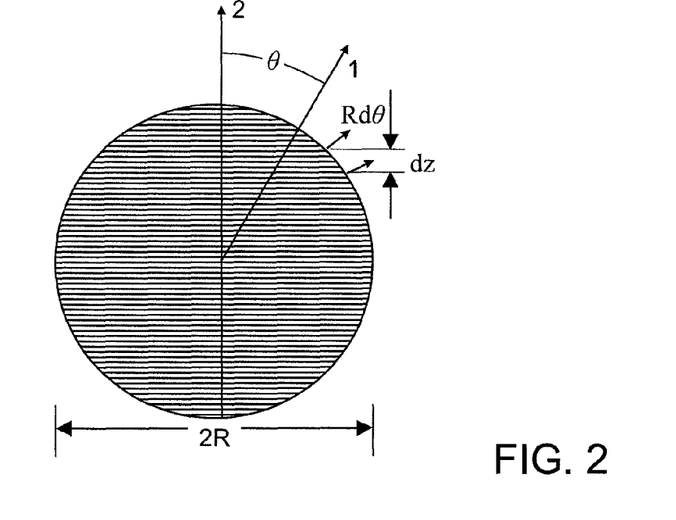
FIG. 2 illustrates a spherical coil assembly with the coils having a uniform turns density with respect to a central (-Z-) axis.

The coil assembly of a preferred embodiment of the present invention provides a transportable MRI system that can be used for head scans or another anatomical regions of the human body or animal bodies that can be inserted within the volume of the assembly, which is referred to as a spherical "fluxball" coil. It has the inherent advantage that the magnetic field is completely uniform within the entire region inside of the sphere with a point magnetic dipole field outside the sphere as shown in FIG. 1. This coil can be wound with thin wire with turns density distributed sinusoidally between the north and south poles of the sphere. If the pitch in the coil needed to connect the loops with each other is small and the loops of varying diameter wound around the sphere at constant levels of z are uniformly spaced, as shown in FIG. 2, the N turn coil carrying a current I wound around a sphere of radius R has a surface current density $$K_\varphi = \frac{Ni}{2R}\sin\theta \qquad (1)$$

The magnetic field inside and outside the sphere is then $$H = \frac{Ni}{3R}[i_r\cos\theta - i_\theta\sin\theta] = \frac{Ni}{3R}i_z \quad r < R \qquad (2)$$

$$H = \frac{Ni}{6R}(R/r)^3[i_r 2\cos\theta + i_\theta\sin\theta] \quad r > R$$

The self-inductance of this spherical coil is $$L = \left(\frac{2}{9}\right)\pi N^2 \mu_0 R \qquad (3)$$

At the cost of some weight by surrounding the sphere with high magnetic permeability iron ($\mu \to \infty$ for $r>R$), the magnetic field outside the sphere can be removed and the magnetic field inside the sphere and the self-inductance increased by 50% to $$H = \frac{Ni}{2R}[i_r\cos\theta - i_\theta\sin\theta] = \frac{Ni}{2R}i_z \quad r < R \qquad (4)$$
$$H = 0 \qquad r > R$$
$$L = \left(\frac{1}{3}\right)\pi N^2 \mu_0 R \qquad (5)$$

Figure 3:
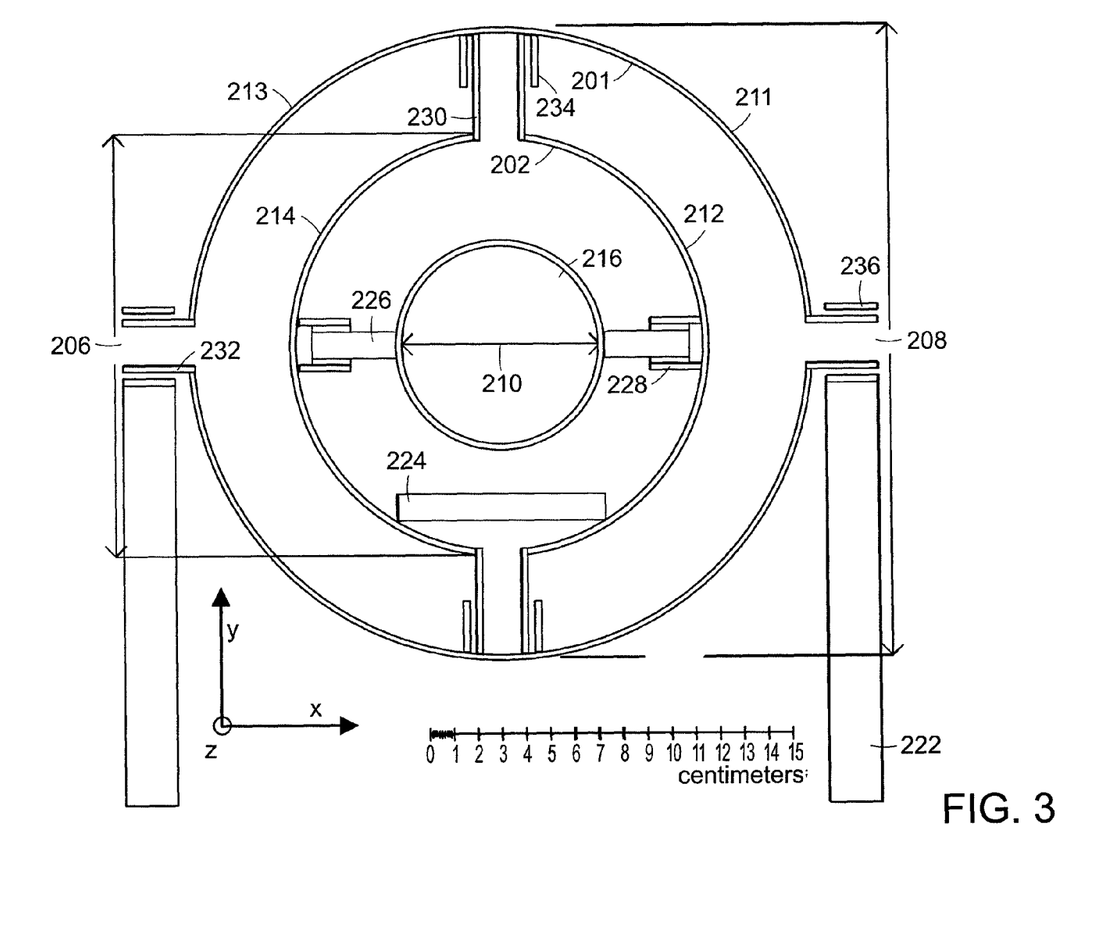
FIG. 3 shows a coil configuration for a two-flux-coil activation apparatus according to a preferred embodiment of the invention.

Because of the uniform magnetic field properties of the spherical "fluxball" coil, two concentric spherical coils were built to provide a pair of spherical "fluxball" coils. A representative design of the coils with a total magnetic field inside the inner sphere of about 25 milliTesla from each coil with a drive current of 5 amperes in each coil with 1280 turns on the inside sphere and 1920 turns on the outside sphere is shown in FIG. 3. Further details regarding the structure and use of a spherical coil magnet assembly can be found in U.S. application Ser. No. 11/525,234, filed on Sep. 21, 2006, the entire contents of which is incorporated herein by reference. The power required for the inner spherical coil is about 237 watts and on the outer coil is about 531 watts. With both coils aligned to create magnetic fields in the same direction and excited by DC or in phase sinusoidal currents, the maximum magnetic field inside the inner sphere is about 50 milliTeslas. If the coils are oriented at right angles to each other so that the magnetic fields inside each coil are perpendicular, magnetic fields at controlled angles can be arranged. The purpose of this feature is to drive each coil with sinusoidal currents at 90 degrees phase difference $$i_1 = I\sin(\omega t)$$
$$i_2 = I\cos(\omega t) \qquad (6)$$

With the coils 90 degrees out of phase in time and also at right angles in orientation, the resulting magnetic field is rotating at angular speed $\omega$. The purpose of this coil is to use such rotating uniform magnetic fields to provide spin-up flows in ferrofluids. This provides a system to select spin diffusion and to determine the values of spin viscosity in the ferrofluids. Such a spherical "fluxball" coil can be used for imaging by preparing a ferrofluid with magnetic nanoparticles in a liquid carrier, positioning the ferrofluid in a field region of a magnetic resonance imaging (MRI) system, and actuating a spin velocity or linear velocity of the magnetic nanoparticles to alter the scalar or tensor complex magnetic susceptibility of the ferrofluid. The method provides, inter alia, for using the spinning magnetic nanoparticles to heat or cool a region of interest as well as acquire an image of the nanoparticles within a region of interest. The system can also alter local effective viscosity, diffusion coefficient, magnetic field, and/or other electromagnetic and/or physiochemical properties, cause local mixing and/or enhance diffusion in drug delivery.

The spherical "fluxball" for a magnetic resonance imaging (MRI) coil can be a compact and light-weight electromagnet to create a highly uniform magnetic field to be used with a transportable MRI system. Such a spherical coil assembly electromagnet can be worn like a helmet for use in emergency medicine clinics and hospitals for diagnosis and assessment of traumatic brain injuries. A preferred embodiment for MRI uses a single spherical coil excited by a DC current to create a highly uniform DC magnetic field. Another preferred embodiment for research, diagnostic, and/or therapeutic interventions in association with MRI can use two or more spherical coils at relative angles to each other and excited by multiple AC currents with phase differences to create oscillating and rotating magnetic fields that can be useful for therapeutic functions throughout the entire body. With the use of injected magnetic material other therapeutic functions can be performed within spherical electromagnets with DC, AC, and/or rotating magnetic fields. These include hyperthermia treatment with accurate control of delivery of thermotherapy, real-time in vivo monitoring of the effects of thermotherapy, enhanced external control of image contrast; changing of local effective viscosity, diffusion coefficient, magnetic field due to controlled changes in local magnetic properties or magnetic fields which can, for example, be useful in directed drug delivery. Another preferred embodiment can employ using sharp magnetic nanoparticles for cutting, scraping, abrading, or removing biological material such as tissue, plaque, gall stones, kidney stones, and/or opening blocked vessel channels such as veins, arteries, urethra, etc., inter alia.

Figure 4:
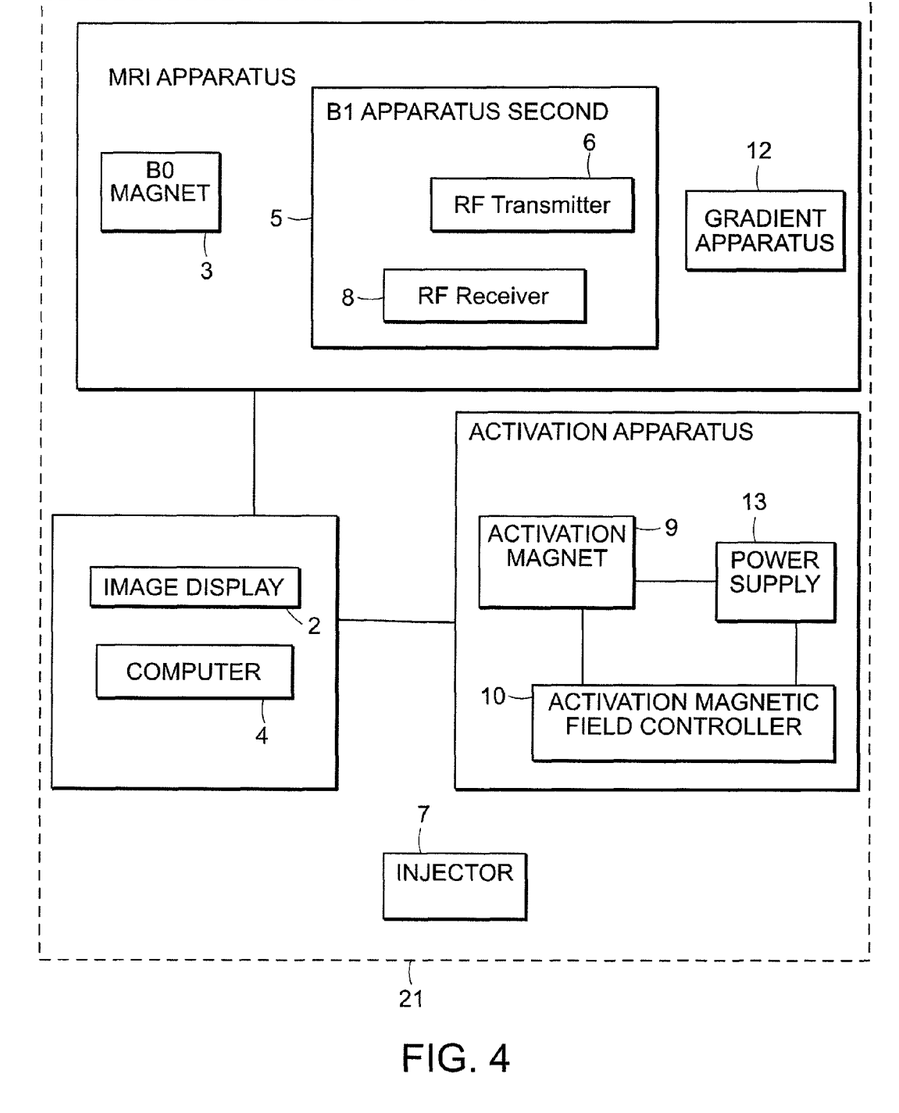
FIG. 4 illustrates a preferred embodiment of a magnetic field tunable MRI system in accordance with the present invention.
Figure 5A:
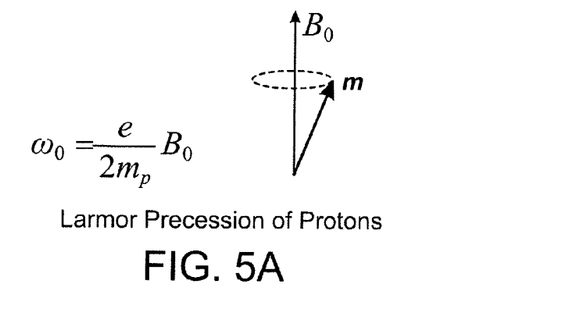
FIG. 5A depicts Larmor Precession of Photons.
Figure 5B:
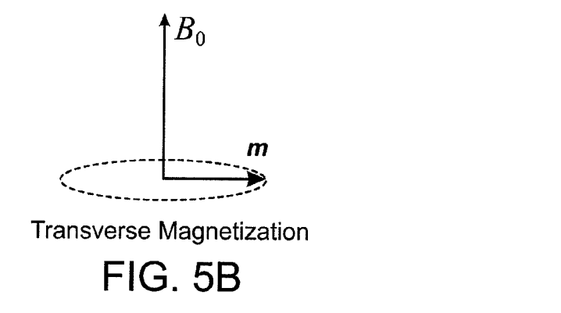
Figure 5C:
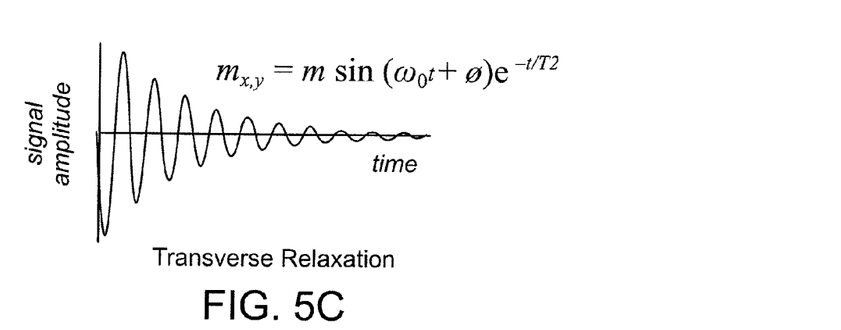
Figure 5D:
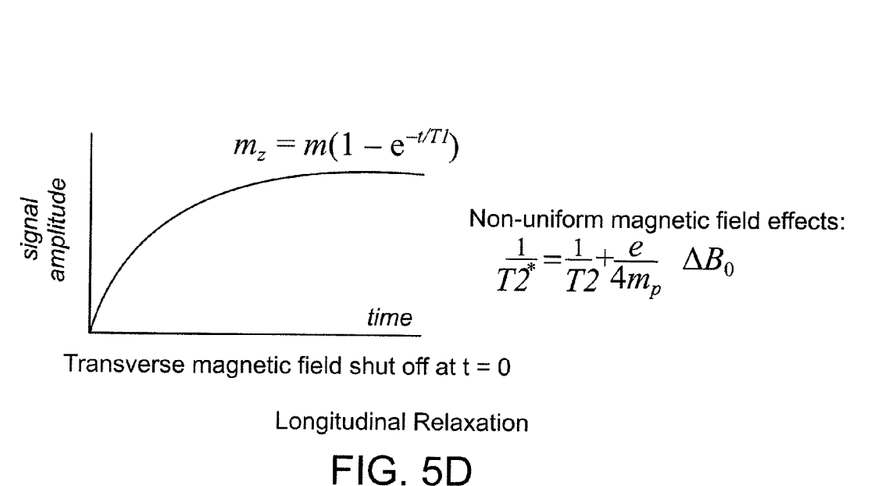

Preferred embodiments of the invention generally relate to magnetic field tuning of magnetic nanoparticle properties for biomedical applications. As shown in FIG. 4, a preferred embodiment of the present invention provides for magnetic field tuning in a magnetic resonance imaging (MRI) system, wherein images are generated in relation to T1 and T2 relaxation times, as depicted in FIGS. 5A-5D. The procedure includes preparing a ferrofluid comprising magnetic nanoparticles (MNPs) in a liquid carrier, positioning the ferrofluid in a field region of the magnetic resonance imaging (MRI) system, and employing an activation magnetic field to actuate a spin of the magnetic nanoparticles to alter the complex magnetic susceptibility (CMS) of the ferrofluid. The ferrofluids thus altered can be manipulated at a distance with a variety of combinations of DC, AC, traveling and rotating magnetic fields and can serve as enhanced contrast agents for MR imaging, enhanced mediators for magnetic hyperthermia and/or hypothermia (induced local heating or cooling, respectively), and magnetokinetic agents for other diagnostic and therapeutic applications.

Referring to FIG. 4, a preferred embodiment of the magnetic field tunable MRI system 21 includes a conventional MRI machine that includes a DC magnet apparatus 3 for generating a magnetic field, a gradient magnetic field generating apparatus 12 for creating a gradient magnetic field with partial components in the x, y and z directions for spatial encoding, an image display device 2, a programmable computer 4, and a radio-frequency (RF) apparatus 5 including a radio-frequency (RF) signal transmitter 6 and receiver 8 for effecting and detecting, respectively, magnetic resonance and relaxation within the magnetic field generated by apparatus 3 with gradient strength of 40 mT/m and slew rate of 150 T/m/s), for example. An injector 7 for injecting into a patient's body a biocompatible (water-base) ferrofluid, an activation magnet apparatus 9 for generating a rotating magnetic field, an activation magnetic field controller unit 10, and a controllable power supply 13 capable of modulating the frequency, amplitude, phase and/or direction, inter alia, of the activation magnetic field(s). The computer 4 also includes detection feedback software to optimally control the MRI apparatus and activation apparatus. In a preferred embodiment, activation amplitude is controlled by current in a winding, frequency and phase controlled by a power supply, and magnetic field direction determined by the design and orientation of windings.

Referring still to FIG. 4, an activation rotating magnetic field apparatus 9 can be of at least two types: uniform magnetic field or non-uniform magnetic field. A uniform activation rotating magnetic field apparatus generally consists of balanced multiphase currents with a two-pole winding (which can include a permanent magnet assembly). Simplest activation electromagnets consist of two windings which are each two-pole: one winding creates an x-directed uniform magnetic field and the other winding creates a uniform y-directed magnetic field. One winding is excited with a current that varies with time as $I_0 \sin(\Omega t)$ and the other winding has a current that varies as $I_0 \cos(\Omega t)$, where $I_0$ is the peak current in each winding. Such a pair of windings creates a magnetic field that rotates in the x-y plane. By appropriate control of the relative polarity of the currents in the two windings, the magnetic field can rotate clock-wise (CW) or counter-clockwise (CCW). Three or more two-pole windings can also be used requiring appropriate relative orientation, relative phases, and amplitudes of the currents to create a uniform rotating magnetic field in the x-y plane. Four-pole, six-pole, eight-pole, etc. machines can create rotating non-uniform magnetic fields which can be used to localize and steer particles where magnetic particles are attracted to strong magnetic field regions and non-magnetic particles are attracted to weak magnetic field regions. Ferrofluids that also have non-magnetic particles are called "negative" ferrofluids. Similarly, dielectric particles with dielectric constant greater than the carrier liquid are attracted to regions with strong electric field while particles with lower dielectric constant than the carrier liquid are attracted to regions of weak electric field. Linear machines with traveling wave windings can similarly transport magnetic or dielectric media along a line.

Figure 6A:
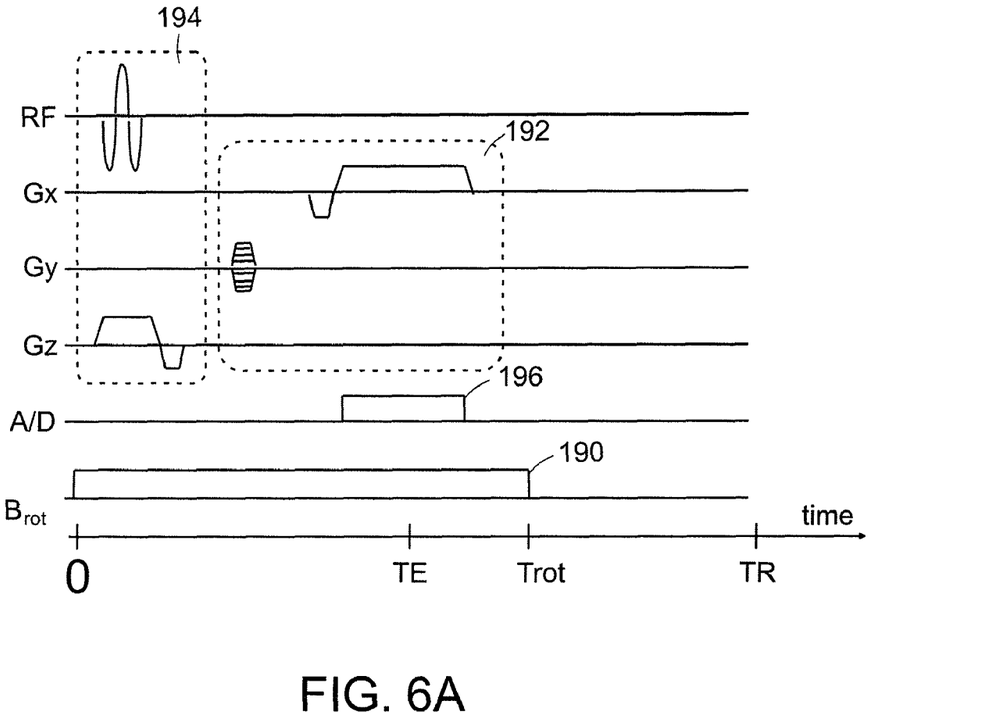
FIG. 6A shows an example of a timing sequence of a preferred method of employing an activation magnetic field with an MRI system, wherein $B_{rot}$ is an activation rotating magnetic field applied to induce particle spin velocity and A/D indicates a sequence of data acquisition, in which analog data is collected and converted to digital data for processing.

FIG. 6A shows an example of the timing or pulse sequence of a preferred method of employing an activation magnetic field with an MRI system, wherein $B_{rot}$ is an activation rotating magnetic field applied to induce particle spin velocity which causes changes in the magnetization of an MNP suspension that consequently changes in the complex value of the CMS. A data-acquisition sequence (the "A/D" sequence) is initiated near time TE, wherein analog data is collected and then converted to digital form, with the digital data being used to enable an imaging operation and further data processing. Sequence 194 indicates excitation at the Larmor frequency, with an envelope of RF modulated waveform, which can occur in the presence of gradient fields, such as, for example, a z-gradient field as shown. Concurrent with sequence 194, in this embodiment, is initiation of a rotational magnetic field, $B_{rot}$, indicated as sequence 190. Following the sequence 194, a next MRI sequence 192 comprises a rapid gradient pulse followed by a slower x-gradient oscillatory excitation. During this sequence 192, a data acquisition sequence 196 is also initiated, wherein analog signals are collected (such as from sensors) and converted to digital form to enable imaging.

Figure 6B:
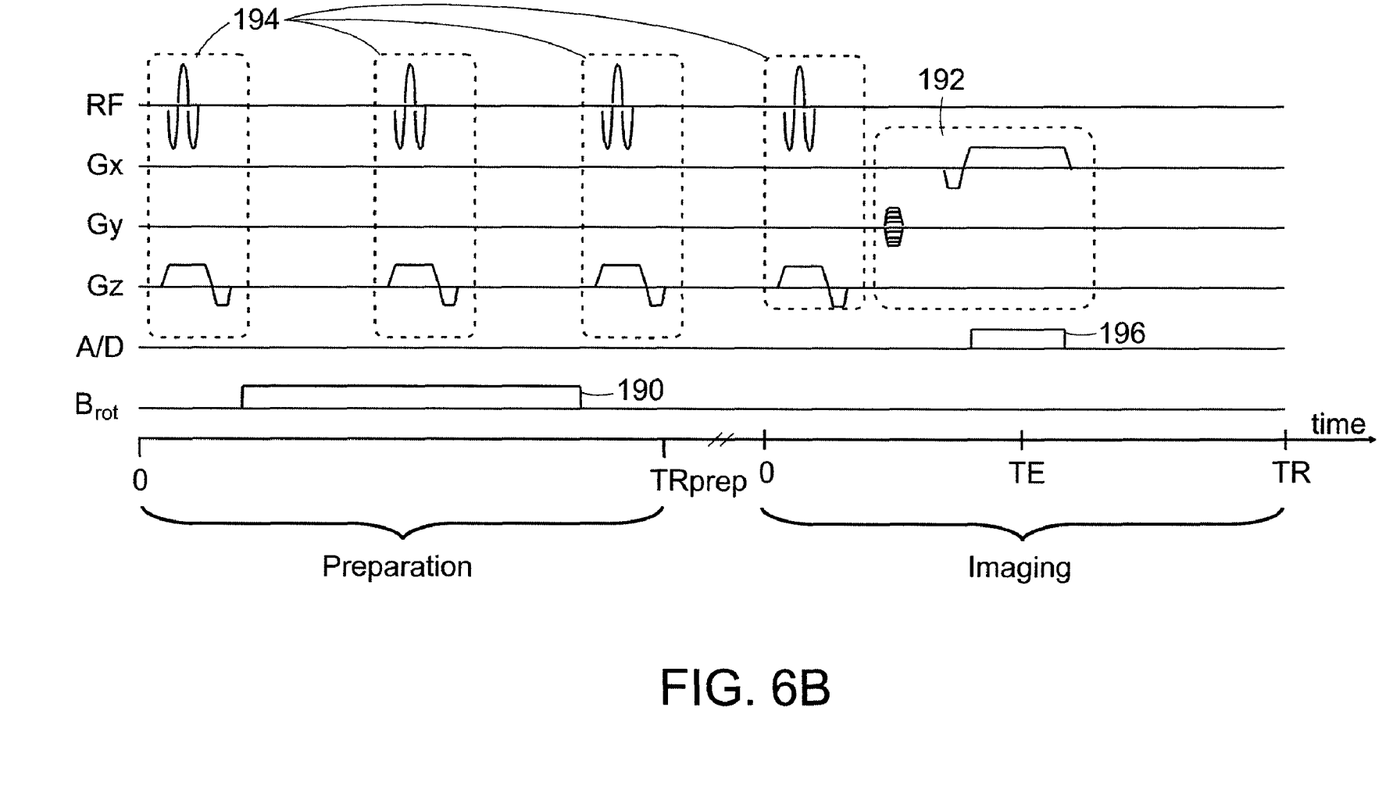
FIG. 6B shows a further example of a timing sequence of an embodiment of the invention providing a method for interleaving time intervals of preparation and imaging.

FIG. 6B illustrates another preferred embodiment providing a method for interleaving time intervals of a preparation phase and imaging. Here, preparation comprises three instances of sequence 194 (again, excitation at the Larmor frequency, with an envelope of RF modulated waveform, which can occur in the presence of gradient fields) with the second instance overlapping sequence 190 (a $B_{rot}$ field interval), the preparation being used to manipulate magnetization to induce imaging contrast and/or other useful characteristics that are enhanced by the application of rotating fields, $B_{rot}$.

The preparation phase is followed by an imaging step with conventional excitation and encoding (i.e., a Larmor excitation frequency sequence 194 followed by the gradient pulse sequence 192 concurrent with data acquisition sequence 196, the same as previously described in the embodiment illustrated by FIG. 6B, except that here the $B_{rot}$ field is turned off during imaging. The two intervals of preparation and imaging can be repeated pair-wise as often as necessary to collect adequate intervention and imaging data.

Figure 6C:
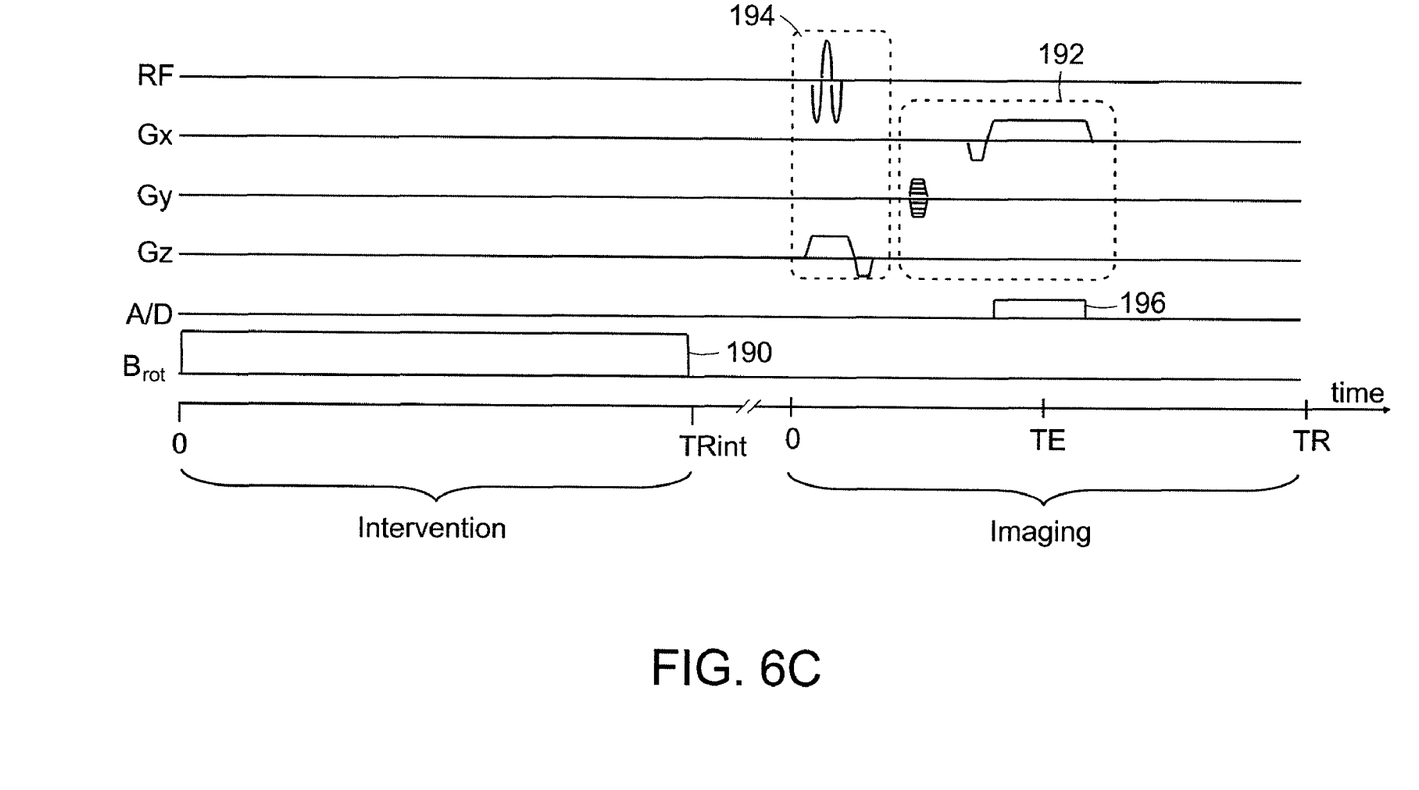
FIG. 6C shows a further example of a timing sequence of an embodiment of the invention providing a method for interleaving time intervals of one or more interventions and imaging.

FIG. 6C shows a further example of a timing sequence for interleaving time intervals of one or more interventions and imaging. In this embodiment, intervention comprising a $B_{rot}$ sequence 190 is used to manipulate MNPs, e.g., to induce thermal conditioning, mix, move and/or spin the particles, and/or change some other condition of the particles or activate their function, with this intervention or activation interval followed by imaging with excitation sequence 194 (Larmor frequency, with an envelope of RF modulated waveform, which can occur in the presence of gradient fields) and encoding sequence 192 (spatial encoding with gradiant fields) with data acquisition sequence 196 to monitor and/or evaluate the effects of the intervention through data processing and imaging. The two intervals (intervention and imaging) can be repeated pair-wise as often as necessary to collect adequate imaging and/or intervention data.

In further embodiments, the sequences described above in FIGS. 6A-6C can be used together in various combinations, and a multitude of additional sequences can be introduced, some of which can use additional activation magnetic and/or electric fields and additional or alternative conventional MRI sequences. The scope of the invention is not limited to the examples given above, but rather extends to include the many additional combinations of sequences that would be apparent to one skilled in the relevant art.

The computer 4 in FIG. 4 can include one or more processors and can include software modules for accepting data from monitoring sensors and/or detectors and for tracking the monitoring of multiple variables associated with the enhanced MRI operation according to the invention, such as, without limitation: temperature; MNP location and movement; magnetic or electric field amplitude, frequency, and/or direction; image data; volume indication; image contrast; T1 and T2 relaxation times; and MNP spin and flow velocities. Computer 4 can further provide feedback signals for automatically and responsively controlling the MRI apparatus components 3, 5 and 12 and/or the activation magnetic field controller 10 and in turn power supply 13 and activation magnet(s) 9 and injector 7. Computer 4 can be programmed for implementing many different sequences (duty cycles) of magnetic and/or electric field activation, such as, for example, the sequence shown in FIGS. 6A-6C.

Multiple processors, software programs and software program objects can be coupled to processing system 4 of a system 21 of the invention (see FIG. 4). Such software program objects can comprise instructions that are stored in memory and executed by the processor(s). The functions for a system of the invention can be performed by a processor executing a computer software instruction in, for example, the form of scripts, software objects, subroutines, modules, compiled programs or any other suitable program components such as downloadable applets or plug-ins. A set of instructions or programs defining system functions can be delivered to a processor in many forms. Exemplary forms can include permanently stored information on a non-writable storage media such as read-only memory devices of a computer that can be readable with an input-output attachment, information alterably stored on writable storage media such as compact disk, optical storage disks digital versatile disk, or a hard drive, information conveyed to a computer through communication media.

Conventional software is available for control over conventional MR imaging (e.g., including the timing and amplitude and phase of B1 magnetic fields and Gradients, and timing of data acquisition). According to embodiments of the invention, additional software modules are used to control the onset, duration, amplitude, frequency, phase, direction, and turn-off of MNP activation magnetic fields. For example, to capture and capitalize on change in contrast in an MRI image due to the application of a treatment intervention process by the MNPs, detection and tracking software based on amplitude or phase change in an MRI image can be used. Further, MNP activation fields can have effects on proton magnetic resonance spins that may be incorporated into and accounted for in the reconstruction of conventional MR images according to a system and methods of a preferred embodiment. The indirect effect of the activated MNP spin causing changes in MRI contrast properties is detected by software.

Preferably, a processor coupled to a system for enhanced MRI according to the invention executes a script or computer program in order to perform the corrections and/or optimization of MRI images from a subject based on the magnetic and RF signal image reconstruction. For example, the processor can be associated with the system so as to determine or analyze one or more parameters indicative of the onset or progression of a disease state in a subject, such as, for example, the progression of cardiovascular disease or a cancer. In one embodiment, the marker can be a standardized and quantifiable ferrofluid agent coupled with a biological marker that is based on the ratio of activity in an imaged region compared to background activity.

The invention also provides a method for standardizing and quantifying enhanced MR images. For example, a method of the invention can be practiced in order to standardize and quantify brain MR images. The data based on multiple sensing of RF signals and monitored EM fields resulting from one or more interventions, from diagnostic and/or therapeutic magnetic or electric fields or pulses, from MNP and/or ferrofluid motions and/or from other operations of the system according to the invention can be collected by a system of the invention that can be used to perform imaging. A method of the invention can also comprise correcting obtained images of the subject based on data that is collected from one or more imaging phantoms. The method of the invention can also comprise determining a suitable optimal marker and/or ferrofluid agent for a particular research, diagnostic and/or therapeutic application.

The methods disclosed herein according to the invention can be translated from the form disclosed herein to software and/or computer program form, which methods relate to the quantifiable and controllable relationships of applied magnetic fields with components of the complex magnetic susceptibility of magnetic nanoparticles (MNPs) and/or ferrofluid comprised of MNPs, of applied electric fields with scalar and/or tensor components of the complex dielectric susceptibility of dielectric nanoparticles (DNPs) and/or ferrofluid comprised of DNPs, changes in spin velocity of MNPs or DNPs, changes in magnetic forces and torques caused in MNPs by various changes in magnetic and/or electric fields (including, without limitation, rotating, oscillating, translational, uniform, AC and DC fields), thermal effects in ferrofluids caused by particle spin and changing magnetic and/or electric fields, induced changes in field states in a subject area caused by MNP or DNP spin velocity and/or by changes in MNP or DNP spin velocities, and interactive effects and/or feedbacks between applied fields and between induced fields and applied fields.

The processing can be modified according to an embodiment of the invention to provide for correcting for and/or utilizing artifacts induced upon the conventional MRI fields and signal owing to the activation magnetic and/or electric field and/or to incorporate the activation field(s) into the image reconstruction.

The mathematical expressions and relationships discussed in this application, including the numbered equations and the many physical parameters, properties, forces, processes and design criteria that they represent, are part of the disclosed method of the invention. These mathematical expressions and relationships enable quantification, analysis, deconvolution, conversion and other operations related to the method of the invention, including, without limitation, signal processing, imaging, monitoring, prediction, and control related to the method of the invention.

The ferrohydrodynmaic equations for oscillating and rotating magnetic fields described with complex amplitudes are a non-linear, complex-variable system, which can be solved by numerical simulation. Processing of these solutions for the relevant context of each embodiment of the invention can be implemented in computer software programs, modules and/or scripts. For example, FEMLAB® software is a commercial numerical finite element multiphysics package available from Comsol, Inc. (Burlington, Mass.), which can be used to perform the numerical simulations. A scripting language allows definition of FEMLAB® software models in terms of simple commands that can be incorporated into the MATLAB® computational software package (MathWorks, Natick, Mass.) scripts. The numerical solution for the full ferrohydrodynamic governing equations is approached by decoupling the system non-linear differential equations into two linear systems that are easily solved by FEMLAB® finite element models. An iterative procedure is used to numerically solve the set of governing ferrohydrodynamic equations. The algorithm starts with initial estimates for the body torque and force densities as functions of radius. Assumed forms for $T_z(r)$ and $F_\phi(r)$ are then used to numerically solve the governing fluid mechanical equations, where $T_z$ is the z directed torque density and $F_\phi$ is the azimuthal component of the time average force density in the ferrofluid volume, being given by $$F_\phi - 2\zeta \frac{\partial \omega_z}{\partial r} + (\eta + \zeta)\left(\frac{\partial^2 v_\phi}{\partial r^2} + \frac{1}{r}\frac{\partial v_\phi}{\partial r} - \frac{v_\phi}{r^2}\right) = 0 \quad \text{(Eq. 36)}$$

$$T_z + 2\zeta\left(\frac{\partial v_\phi}{\partial r} + \frac{v_\phi}{r} - 2\omega_z\right) + \eta'\left(\frac{\partial^2 \omega_z}{\partial r^2} + \frac{1}{r}\frac{\partial \omega_z}{\partial r}\right) = 0 \quad \text{(Eq. 37)}$$

where $\zeta$ [Ns/m$^2$] is the vortex viscosity and from microscopic theory for dilute suspensions obeys the approximate relationship, $\zeta = 1.5\eta\phi$, where $\phi$ is a volume fraction of particles, $\eta$ is the dynamic shear viscosity [Ns/m$^2$], and $\eta'$ [[Ns/m$^2$] is the shear spin viscosity. These results are subsequently input into equations known as the magnetization constitutive equations and the resulting electro-magnetic governing equations are numerically solved for the magnetic potential complex amplitude $\hat{\Psi}(r)$. Knowledge of $\hat{\Psi}(r)$ determines the magnetic field intensity components $\hat{H}_r(r)$, $\hat{H}_\phi(r)$ and magnetization $\hat{M}_r(r)$, $\hat{M}_\phi(r)$ and consequently a new estimate of the body torque and force densities is made. The new estimate can be used as input to the fluid mechanics governing equations to produce new estimates for the velocity and spin velocity. The algorithm allows this iterative procedure to continue until the successive estimates converge on a final value and further iterations have negligible effect on the solution.

For uniform or non-uniform rotating magnetic fields, three coils can be configured orthogonally, allowing control over three components of the dipole moment in all three spatial dimensions. Other angular orientations between the coils can be used. FIG. 3 illustrates one design, shown in cross-section, of an example of a combination of coil windings for an activation apparatus constructed in spherical orientation according to a preferred embodiment of the invention. Although it will be appreciated that numerous other configurations and designs can be constructed according to the invention, FIG. 3 generally illustrates embodiments wherein a rotating and/or oscillating uniform magnetic field is created within a region of interest, so that the field functions as an activation magnetic field created by activation magnet(s) 9 shown in FIG. 4.

Referring to FIG. 3, a double flux-sphere can be constructed to apply uniform rotating fields to a ferrofluid-containing, activation analysis chamber 216, which activation chamber 216 can be used for biomedical research and/or medical diagnosis and/or therapy, particularly when constructed in combination with an MRI apparatus according to a preferred embodiment of the invention. As depicted in FIG. 3, an outer flux sphere 201 having an outer flux sphere diameter 208 has disposed within it an inner flux sphere 202 with inner flux sphere diameter 206, where magnetic coil windings 213 and 214 are coiled around the outer and inner spheres, respectively, guided by coil-winding guide/holding flanges 211 and 212 on each of the outer and inner sphere, respectively. Activation chamber 216 having chamber diameter 210 is located inside the inner flux sphere 202. An instrument platform 224 can be attached inside the inner flux sphere. Inner flux sphere support arm(s) 230 can engage inner flux sphere support arm bearing/holder(s) 234 which can attach to the interior of the outer flux sphere 201, sample chamber support arm(s) 226 can engage sample chamber support arm bearing(s) 228 attached to the interior of the inner flux sphere 202, and outer flux sphere arm(s) 232 can engage outer flux sphere arm support bearing(s) 236 attached to main apparatus support(s) 222. The volume within the system can have a size suitable for receiving a small animal such as a mouse or a plant or a foot, hand or head of the human body. Alternatively the indicated sizes can be scaled up to receive the human body.

In FIG. 3, within the spherical region inside inner coil 202, the outer coil 201 creates a uniform magnetic field in the x direction and inner coil 202 creates a uniform magnetic field in the y direction. If outer coil 201 is excited with current $I_1$ sin ($\omega t$) and inner coil 202 is excited with current $I_2$ cos ($\omega t + \phi$), then the magnetic field inside inner coil 202 in general has a rotating and oscillating part dependent on the phase difference $\phi$ and relative current amplitudes and polarities of $I_1$ and $I_2$. By appropriate choice of phase angle $\phi$ and polarities and amplitudes of $I_1$ and $I_2$, the magnetic field within inner coil 202 can be made purely rotating clockwise or counter-clockwise, purely oscillating, or any combination of rotating and oscillating magnetic fields. The windings shown are 2-pole windings that create uniform magnetic fields, but multi-pole windings, such as 4-pole, 6-pole, and higher multi-pole windings can also be used to create non-uniform magnetic fields. Although FIG. 3 only illustrates two coils, a third winding can be added to create a rotational field that can be arbitrarily orientated in 3-dimensional space. The third winding can generate a field that is orthogonal to the other two field components generated by the two other orthogonal coil elements Table 3, below, provides operating parameters, winding specifications and structure specifications for a set of embodiments of the invention, each corresponding to differing design configurations, such as, for example designs labeled herein as D1a-g, D2a-b and D3a-b. In one preferred embodiment, at least one of the specifications for designs D1a-g, among other specifications, can be utilized with the double-sphere, rotational magnetic field, activation apparatus design illustrated in FIG. 3.

TABLE 3

Operating parameters, winding specifications and structure specifications for examples of activation apparatus according to multiple embodiments of the invention.

| | EXAMPLES OF DIFFERING EMBODIMENTS | | | | | | | | | | |
|---|---|---|---|---|---|---|---|---|---|---|---|
| | D1a | D1b | D1c | D1d | D1e | D1f | D1g | D2a | D2b | D3a | D3b |
| Operating Parameters | | | | | | | | | | | |
| B field (Gauss) | 235 | 235 | 233 | 249 | 218 | 217 | 216 | 264 | 264 | 243 | 244 |
| Current (Amps) | 5 | 5 | 5 | 5 | 10 | 10 | 10 | 5 | 5 | 5 | 5 |
| Average radius (m) | 0.1 | 0.15 | 0.1 | 0.15 | 0.1 | 0.15 | 0.19 | 0.1 | 0.15 | 0.11 | 0.17 |
| Total turns | 1120 | 1680 | 1120 | 1792 | 520 | 760 | 980 | 1260 | 1890 | 1280 | 1920 |
| Power (Watts) | 230 | 516 | 354 | 847 | 267 | 575 | 954 | 258 | 581 | 237 | 531 |
| Winding Specifications | | | | | | | | | | | |
| Wire (AWG) | 18 | 18 | 18 | 18 | 15 | 15 | 15 | 18 | 18 | | |
| Wire diameter (mm) | 1.02 | 1.02 | 1.02 | 1.02 | 1.45 | 1.45 | 1.45 | 1.02 | 1.02 | | |
| # conductor layers | 7 | 7 | 7 | 7 | 5 | 5 | 5 | 7 | 7 | | |
| turns/spool | 56 | 56 | | | | | | | | | |
| winding length (m) | 559 | 1252 | | | | | | 628 | 1408 | | |
| Resistance (ohms) | 9.19 | 20.65 | 14.14 | 33.88 | 2.67 | 5.75 | 9.54 | 10.34 | 23.23 | | |
| Turns/slot | | | 8 | 8 | 2 | 2 | 2 | 63 | 63 | | |
| Structure specifications | | | | | | | | | | | |
| Number spools | 20 | 30 | | | | | | | | | |
| Spool height (mm) | 10 | 10 | | | | | | | | | |
| Barrel width (mm) | 20 | 20 | | | | | | 20 | 20 | | |

TABLE 3-continued

Operating parameters, winding specifications and structure specifications for examples of activation apparatus according to multiple embodiments of the invention.

| | EXAMPLES OF DIFFERING EMBODIMENTS | | | | | | | | | | |
|---|---|---|---|---|---|---|---|---|---|---|---|
| | D1a | D1b | D1c | D1d | D1e | D1f | D1g | D2a | D2b | D3a | D3b |
| Flange height (mm) | 0.5 | 0.5 | | | | | | 0.5 | 0.5 | | |
| Structure material | Del. | Del. | Del. | Del. | Del. | Del. | Del. | Del. | Del. | Del. | Del. |
| No. slots | | | 20 | 32 | 52 | 76 | 98 | 20 | 30 | | |
| Slot height (mm) | | | 2.04 | 2.04 | 3.04 | 3.04 | 3.04 | 10 | 10 | | |
| Inner Radius (cm) | | | 8 | 13 | 8 | 12.7 | 17 | | | | |
| Outer radius (cm) | | | 10 | 15 | 10 | 14.7 | 19 | | | | |

"Del." is abbreviation for Delrin which is used as a structure material.

It will be appreciated that the specifications in Table 3 are suitable for small analysis chambers and that the system can be scaled up to dimensions for a larger chamber and activation apparatus suitable for human subjects. In such an embodiment wherein an MRI apparatus is combined with the activation apparatus, the activation chamber can be as large as the internal bore of the MRI magnet, so that a patient can be positioned inside the rotating magnetic field of the apparatus. Alternatively, the activation chamber can be smaller, designed to enclose a particular body part being treated and/or imaged, such as an arm, leg, hand, foot or brain, inter alia. Also, alternative embodiments can include cylindrical designs and modified spherical designs wherein fixed openings of various sizes can allow placement of an object or subject within a central chamber or core, or where an entrance to the chamber through the structure can be substantially opened by separating coil elements to allow access and substantially closed during operation. The inner radius of the coil assembly can be in a range of 8 cm to 50 cm.

Again referring to FIG. 3, a further preferred embodiment provides for an activation apparatus in a system that provides measurement feedback of CMS tensor elements that vary with spin velocity created by the activation rotating magnetic fields. The central activation treatment and imaging chamber 216 of a preferred embodiment contains at least some amount of ferrofluid and changes in the resulting dipole field outside the chamber 216 but within the inner coil 202 can be measured by the instruments in platform 224. This enables determination of each element of the CMS tensor. In addition, torque and force sensors can be positioned in the support arms 226 of the central activation chamber 216 and/or in the bearings 228 so that the torque and force on the ferrofluid in chamber 216 can be measured as a function of magnetic field amplitude, frequency, and direction, inter alia. Ultrasound transducers can be placed within the wall of the activation chamber 216 that measure the velocity profiles from which the spin velocity can be calculated.

Equivalents

While the invention has been described in connection with specific methods and apparatus, those skilled in the art will recognize other equivalents to the specific embodiments herein. It is to be understood that the description is by way of example and not as a limitation to the scope of the invention and these equivalents are intended to be encompassed by the claims set forth below.

What is claimed is:

1. A method of magnetic resonance imaging (MRI) comprising:

using a spherical coil assembly to generate a magnetic field within the coil assembly;

positioning an object to be imaged within the spherical coil assembly;

using an RF assembly positioned relative to the spherical coil assembly, the RF assembly generating a magnetic resonance signal; and acquiring a magnetic resonance image of the object within a region of interest.

2. The method of claim 1 further comprising providing a second spherical coil that is concentrically mounted within the spherical coil assembly.

3. The method of claim 2 further comprising providing a third spherical coil.

4. The method of claim 3 further comprising operating the first, second and third controls to control three orthogonal magnetic field components within the coil assembly.

5. The method of claim 3 further comprising applying a third magnetic field having a third orientation to the region of interest.

6. The method of claim 1 further comprising forming an image of brain tissue.

7. The method of claim 1 further comprising actuating the coil with a controller.

8. The method of claim 1 further comprising providing the coil assembly including a fluxball.

9. The method of claim 1 further comprising imaging a region of interest in a small animal or plant material.

10. The method of claim 1 further comprising applying a first magnetic filed having a first orientation to a region of interest with a first coil assembly and applying a second magnetic field having a second orientation to the region of interest that is orthogonal to the first orientation with a second coil assembly.

11. The method of claim 1 further comprising separating portions of the coil assembly to provide an opening for insertion of an object to be imaged.

12. The method of claim 1 further comprising providing a coil assembly having an inner radius in a range of 8 cm to 50 cm.

13. The method of claim 1 further comprising applying a gradient field with the coil assembly with a pulse sequence to image an object.

14. A magnetic resonance imaging (MRI) system comprising:

a first magnetic field generating system providing a magnetic field within a spatial region in which material to be imaged is located, the generating system including a spherical coil assembly;

a control system connected to the spherical coil assembly;

an RF electromagnetic field generating and receiving system positioned relative to the spherical coil assembly, the RF system generating magnetic resonance (MR) data in response to magnetic resonance within the material;

a data processing system that receives and processes the collected MR data, the processing system including a controller that generates a plurality of pulse parameters.

15. The system of claim 14 wherein the processing system is programmed to process image data.

16. The system of claim 14 wherein the processing system generates an actuating signal to actuate an activation magnetic field.

17. The system of claim 14 wherein the control system actuates a first magnetic field generating system for spatial encoding.

18. The system of claim 14 wherein the generating system comprises an activation magnetic field generating system comprising a plurality of coil assemblies generating rotating magnetic field components in different directions.

19. The system of claim 18 wherein the activation magnetic field generating system comprises an activation magnet and an activating magnetic field controller and wherein the processing system is programmed to actuate a pulse sequence including an activation pulse component and an imaging pulse component in sequence.

20. The system of claim 19 wherein the pulse sequence comprises a preparation period and a first imaging period, an RF component, a plurality of gradient field components, an acquisition period, and an activation magnetic field component having a period of spin actuation $T_{rot}$.

21. The system of claim 20 wherein the pulse sequence includes a rotating activation period and an imaging period.

22. The system of claim 19 wherein the processing system generates an actuating signal to actuate the activation magnetic field.

23. The system of claim 19 wherein the activation magnetic field generating system comprises a plurality of spherical coil assemblies generating rotating magnetic field components in different directions.

24. The system of claim 14 wherein the coil assembly comprises a first spherical coil assembly that generates a first magnetic field component and a second spherical coil assembly that generates a second magnetic field component that is orthogonal to the first magnetic field component.

25. The system of claim 24 wherein a third magnetic field component is orthogonal to the first component and the second component.

26. The system of claim 14 wherein the first magnetic field generating system comprises a static magnetic field generating system and a gradient magnetic field generating system.

27. The system of claim 14 wherein the spatial region comprises a volume having a size to receive a human body or a portion thereof, such as the head, hand or foot, an animal or plant.

28. The system of claim 14 wherein the system operates at a low magnetic field condition of less than 0.5 Tesla.

29. The system of claim 14 wherein the processing system is programmed with a software program to process data.

30. The system of claim 14 wherein the coil assembly separates to provide an opening for insertion of a region of the body, such as a human head.

31. The system of claim 14 wherein the coil assembly has an inner radius in a range of 8 cm to 50 cm.

* * * * *

UNITED STATES PATENT AND TRADEMARK OFFICE
CERTIFICATE OF CORRECTION

| | | |
|---|---|---|
| PATENT NO. | : 8,093,896 B2 | Page 1 of 1 |
| APPLICATION NO. | : 12/442235 | |
| DATED | : January 10, 2012 | |
| INVENTOR(S) | : Markus Zahn | |

It is certified that error appears in the above-identified patent and that said Letters Patent is hereby corrected as shown below:

Column 1, line 17, "that that" should read -- that --; and

Column 10, line 29, "elements" should read -- elements. --.

Signed and Sealed this
Nineteenth Day of June, 2012

David J. Kappos
*Director of the United States Patent and Trademark Office*